United States Patent
Kao et al.

[11] Patent Number: 6,030,878
[45] Date of Patent: Feb. 29, 2000

[54] METHOD OF FABRICATING A DYNAMIC RANDOM ACCESS MEMORY CAPACITOR

[75] Inventors: Chia-Hung Kao, Tainan; Hal Lee, Taipei, both of Taiwan

[73] Assignee: United Microelectronics Corp., Hsinchu, Taiwan

[21] Appl. No.: 09/200,195

[22] Filed: Nov. 25, 1998

[51] Int. Cl.[7] .................................................. H01L 21/20
[52] U.S. Cl. .......................................... 438/396; 438/253
[58] Field of Search ...................................... 438/396, 397, 438/253, 254, 255, 256, 398, 399

[56] References Cited

U.S. PATENT DOCUMENTS

| | | | |
|---|---|---|---|
| 5,330,614 | 7/1994 | Ahn | 438/396 |
| 5,399,518 | 3/1995 | Sim et al. | 438/396 |
| 5,438,013 | 8/1995 | Kim et al. | 438/396 |
| 5,444,005 | 8/1995 | Kim et al. | 438/396 |
| 5,712,202 | 1/1998 | Liaw et al. | 438/253 |

*Primary Examiner*—Tuan H. Nguyen
*Attorney, Agent, or Firm*—Hickman Stephens Coleman & Hughes, LLP

[57] ABSTRACT

A method of fabricating a capacitor includes formation of a first dielectric layer having a contact hole on a substrate. A conductive layer is formed over the substrate and is electrically coupled with a source/drain region through the contact hole. An isolation layer is formed on the conductive layer. The isolation layer and the conductive layer are patterned to form a patterned isolation layer and a raised region over the contact hole. A first spacer is formed on the sidewall of the patterned isolation layer and the raised region. The patterned isolation layer is removed. The first spacer is used as a mask to etch the conductive layer to form another two sidewalls. The first spacer is removed. Two spacers are formed on the two sidewalls and used as masks. The conductive layer is patterned again to form two raised regions concentrically in shape.

20 Claims, 3 Drawing Sheets

METHOD OF FABRICATING A DYNAMIC RANDOM ACCESS MEMORY CAPACITOR

BACKGROUND OF THE INVENTION

1. Field of Invention

The present invention relates to a semiconductor fabricating method. More particularly, the present invention relates to a method of fabricating a Dynamic Random Access Memory (DRAM) capacitor.

2. Description of Related Art

As the function of a microprocessor becomes more powerful, the program and calculation of software becomes more complicated, and thus the need for DRAM storage memory is increased. As the number of semiconductor devices incorporated in integrated circuit increases, a memory cell, which comprises a transfer field effect transistor (TFET) and a storage capacitor, is widely used. In FIG. 1, it is a circuit diagram of a DRAM memory cell. A capacitor C is selected from an array of capacitors used to store information as binary data by charging or discharging the capacitor. Normally, a binary bit is stored in each capacitor. Logic "0" is represented by the discharged state of the capacitor C, whereas logic "1" is represented by the fully charged state of the capacitor C. In general, a dielectric film 101 is deposited between a top electrode (cell electrode) 102 and a bottom electrode (storage electrode) 100. The capacitor C is electrically coupled with a bit line BL. The read/write operations of a DRAM memory cell are performed by the charged/discharged states of the capacitor C. The bit line BL is connected to the drain of a transfer field effect transistor T. The capacitor C is connected to the source of the transfer field effect transistor T. A signal is transmitted through a gate of the transfer field effect transistor T, which is used to control the capacitor C to turn on or turn off the connection with the bit line BL. In other words, the transfer field effect transistor T acts as a switch to control the charged or discharged state of the capacitor C.

In the DRAM manufacturing process, a two-dimensional capacitor called a planar-type capacitor is mainly used for a conventional DRAM having a storage capacity less than 1M (mega=million) bits. In the case of a DRAM having a memory cell using a planar type capacitor, electric charges are stored on the main surface of a semiconductor substrate, and thus the main surface is required to have a large area. This type of a memory cell is therefore not suited to a DRAM having a high degree of integration. For a highly integrated DRAM, such as a DRAM with more than 4M bits of memory, a three-dimensional capacitor, such as a stacked-type or a trench-type capacitor, has been introduced.

With stacked-type or trench-type capacitors, it has been made possible to obtain a larger memory within a similar volume. However, a capacitor with such a simple three-dimensional structure as the conventional stacked-type or trench-type is insufficient for a semiconductor device of an even higher degree of integration, such as a very-large-scale integration (VLSI) circuit having a capacity of 64M bits.

One solution for improving the capacitance of a capacitor is to use a fin-type stacked capacitor. The fin-type stacked capacitor includes electrodes and dielectric layers which extend in a fin shape in a plurality of stacked layers. Hence, the surface area of the electrode is enlarged while the capacitance is increased. This is described by Ema et al., "3-Dimensional Stacked Capacitor Cell for 16M and 64M DRAMs", International Electron Devices Meeting, pp. 592–595, December 1988, and U.S. Pat. Nos. 5,071,783; 5,126,810; and 5,206,787.

Another solution for improving the capacitance of a capacitor is to use the cylindrical-type stacked capacitor. The cylindrical-type stacked capacitor includes electrodes and dielectric films which extend in a cylindrical shape to increase the surface areas of the electrodes. This is described by Wakamiya et al., Novel Stacked Capacitor Cell for 64-Mb DRAM, 1989 Symposium on VLSI Technology Digest of Technical Papers, pp. 69–70, and U.S. Pat. No. 5,077,688.

With the trend toward increased integration density, the size of the DRAM cell must be further reduced. Generally, a reduction in the size of the cell leads to a reduction in charge storage capacitance. Additionally, as the capacitance is reduced, the likelihood of soft errors arising from the incidence of -rays is increased. Therefore, there is still a need in this art to design a new structure and methods for further increasing the capacitance of a storage capacitor while occupying a smaller planar area.

SUMMARY OF THE INVENTION

It is an object of the invention to provide a fabricating method for a capacitor, which maintains the capacitance while decreasing the planar area occupied by the capacitor.

It is another object of the invention to decrease the manufacturing costs and increase process tolerance and product yield.

Accordingly, the present invention provides a method of fabricating a capacitor. The method of the present invention comprises providing a substrate having a transfer field effect transistor thereon and the following steps. A first dielectric layer having a contact hole therein is formed on the substrate. A conductive layer is formed over the substrate to fill the contact hole and is electrically coupled with a source/drain region of the field effect transistor. An isolation layer is formed on the conductive layer. The isolation layer and the conductive layer are patterned to form a patterned isolation layer and a raised region, which is a portion of the patterned conductive layer, over the contact hole. A first spacer is formed on the sidewall of the patterned isolation layer and the raised region. The patterned isolation layer is removed. The first spacer is used as a mask. The conductive layer is etched to form another two sidewalls. The first spacer is removed. Two spacers are formed on the two sidewalls and are used as masks. The patterned conductive layer is patterned again to form two raised regions concentrically in shape. The two spacers are removed. A storage electrode is formed. A dielectric film and second conductive layer are formed in sequence over the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
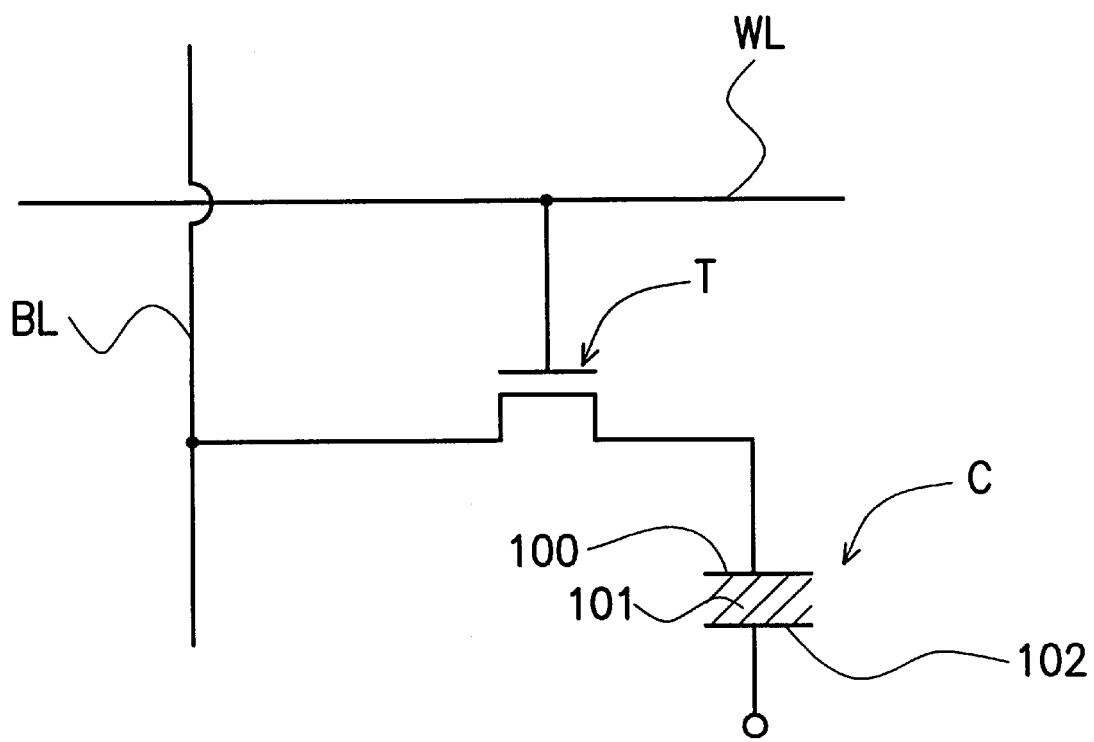
FIG. 1 is a circuit diagram of a dynamic random access memory cell (DRAM).

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing a DRAM capacitor fabricating process according to one preferred embodiment of the invention.

Figure 2A:
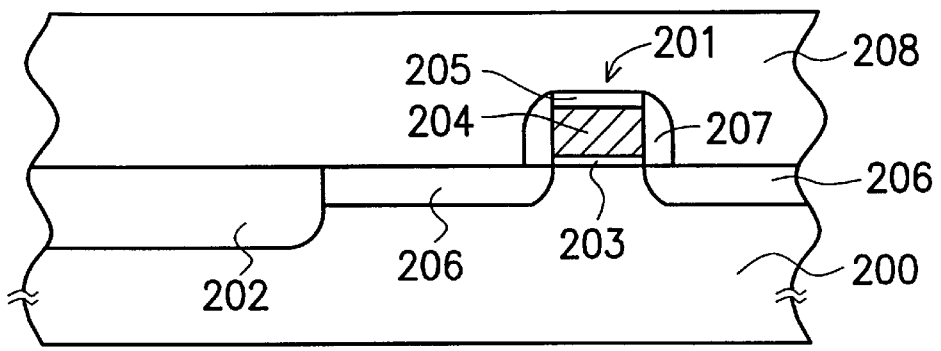
FIGS. 2A through 2F are schematic, cross-sectional views showing a DRAM capacitor fabricating process according to one preferred embodiment of the invention.
Figure 2B:
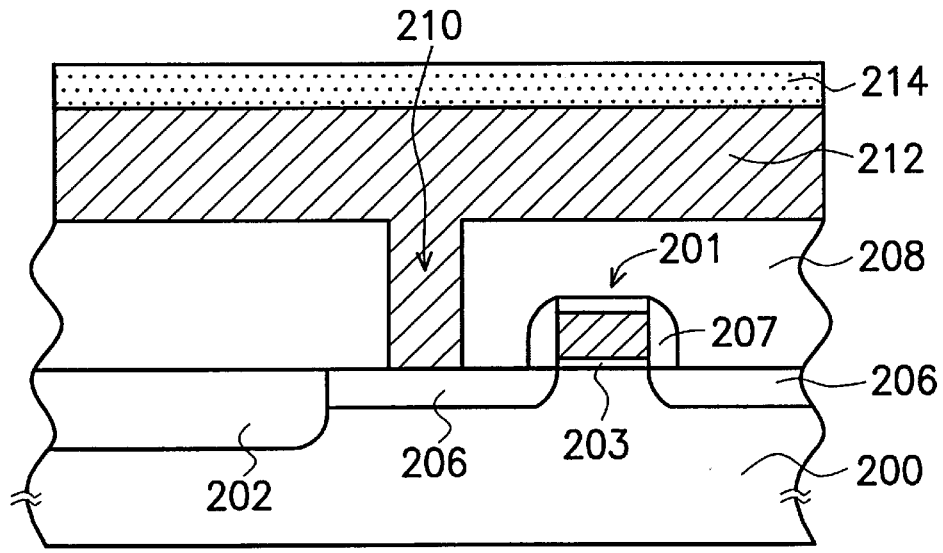

In FIG. 2A, a substrate 200 is provided. The substrate 200 can be a P-type silicon substrate, for example. An isolation structure 202 is formed in the substrate 200. The isolation structure 202 is used to define active regions of the substrate 200. The method of forming the isolation region 202 can be a local oxidation of silicon (LOCOS) method or a shallow trench isolation (STI) method, for example. A field effect transistor 201 is formed on an active region of the substrate 200. The conventional method of forming the field effect transistor 201 includes forming a thin oxide layer (not shown) on the substrate 200 by hot oxidation and then forming a conductive layer (not shown) and an isolation layer (not shown) are in sequence over the thin oxide layer. The thin oxide layer, the conductive layer, and the isolation layer are patterned to form a gate oxide layer 203, a gate conductive layer 204, and a gate cap layer 205. The substrate 200 is doped to form a source/drain region 206 in the substrate 200. The source/drain region 206 is formed beside the bottom surface of the gate oxide layer 203 in the substrate 200. An isolation layer (not shown) is formed over the substrate 200. The isolation layer is etched back to form a spacer 207 on the sidewall of the gate oxide layer 203, the conductive gate layer 204, and the gate cap layer 205, which completes construction of the field effect transistor 201. The conductive gate layer 204 can be a doped polysilicon layer formed by chemical vapor deposition, for example. The material of the gate cap layer 205 and the spacer 207 can be silicon nitride, for example. The gate cap layer 205 and the spacer 207 can be formed by chemical vapor deposition, for example. A dielectric layer 208 is formed over the substrate 200. The material of the dielectric layer 208 includes silicon oxide or borophosphosilicate glass (BPSG). The dielectric layer 208 can be formed by chemical vapor deposition, for example.

In FIG. 9B, the dielectric layer 208 is patterned to form a contact hole 210 in the dielectric layer 208. The contact hole 210 exposes the source/drain region 206. A conductive layer 212 is formed over the substrate 200. The conductive layer 212 covers the dielectric layer 208 and fills the contact hole 210. The conductive layer 212 is electrically coupled with the source/drain region 208 through the contact hole 210. An isolation layer 214 is formed on the conductive layer 212. The material of the conductive layer 212 includes doped polysilicon. The conductive layer 212 can be formed by chemical vapor deposition, for example. The isolation layer 214 can be a silicon nitride layer formed by chemical vapor deposition, for example.

Figure 2C:
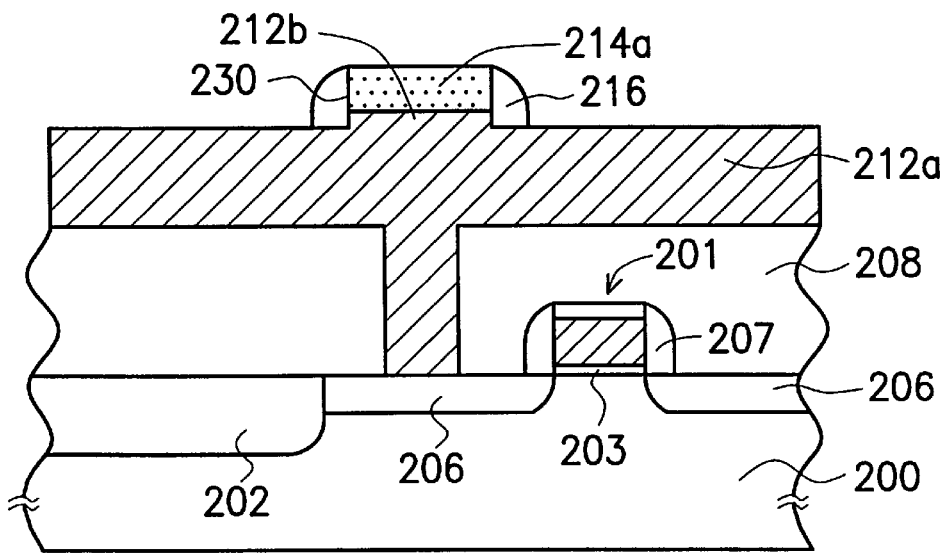

In FIG. 2C, a patterned photoresist layer (not shown) is formed on the isolation layer 214. The patterned photoresist layer is used as a mask to etch the isolation layer 214, and a portion of the conductive layer 212. The photoresist layer is removed to form an isolation layer 214a and a conductive layer 212a. The conductive layer 212a has a raised region 212b region thereon. The raised region 212b is a portion of the conductive layer 212a. The isolation layer 214a and the raised region 212b are located above the contact hole 210. The planar area of the isolation layer 214a and the raised region 212b are the same. A spacer 216 is formed on a sidewall of the isolation layer 214a and the raised region 212b. The steps of forming the spacer 216 includes performing a chemical vapor deposition step at first to form a silicon nitride layer (not shown) over the substrate 200 and is etched back to form the spacer 216. The etching rates of the conductive layer 212a and the spacer 216 are different. The material of the spacer 216 is preferably silicon nitride when the material of the conductive layer 212a is doped polysilicon, for example.

Figure 2D:
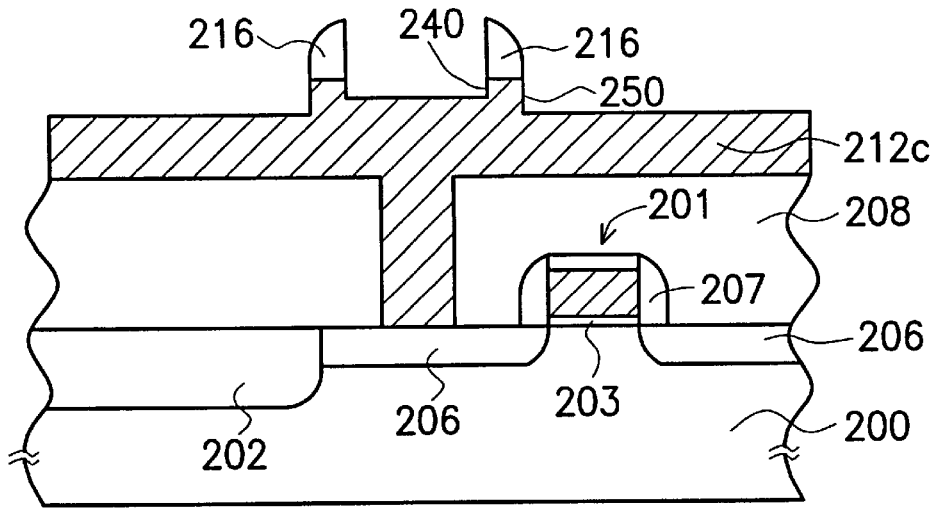

In FIG. 2D, the isolation layer 214a is removed to expose the conductive layer 212a. The isolation layer 214a can be removed by wet etching, such as using $H_3PO_4$ as an etching solution, for example. The spacer 216 is used as a mask. An etch back step is performed to removed a portion of the conductive layer 212a to form a conductive layer 212c. The etch back step can be performed by anisotropic etching. The conductive layer 212c is etched to form a first sidewall 240 and a second sidewall 250.

Figure 2E:
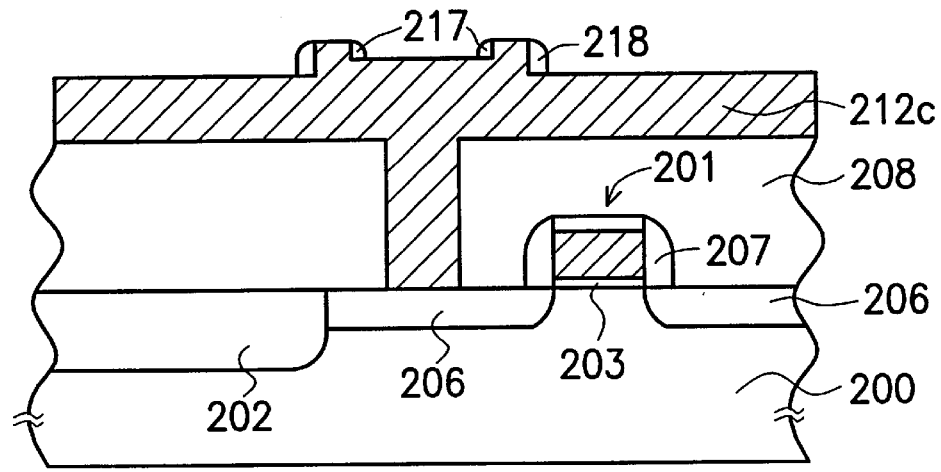

In FIG. 2E, the spacer 216 is removed. The spacer 216 can be removed by wet etching, such as using HF solution, for example. A spacer 217 is formed on the first sidewall 240 of the conductive layer 212c. A spacer 218 is formed on the second sidewall 250 of the conductive layer 212c. The etching rates of the conductive layer 212c and the spacers 217, and 218 are different. The preferable material of the spacers 217 and 218 is silicon oxide when the material of the conductive layer 212c is doped polysilicon, for example. The spacer 217 and spacer 218 can be formed, for example, by chemical vapor deposition to deposit a silicon oxide layer over the substrate 200 and then be etched back to form spacers 217 and 218.

Figure 2F:
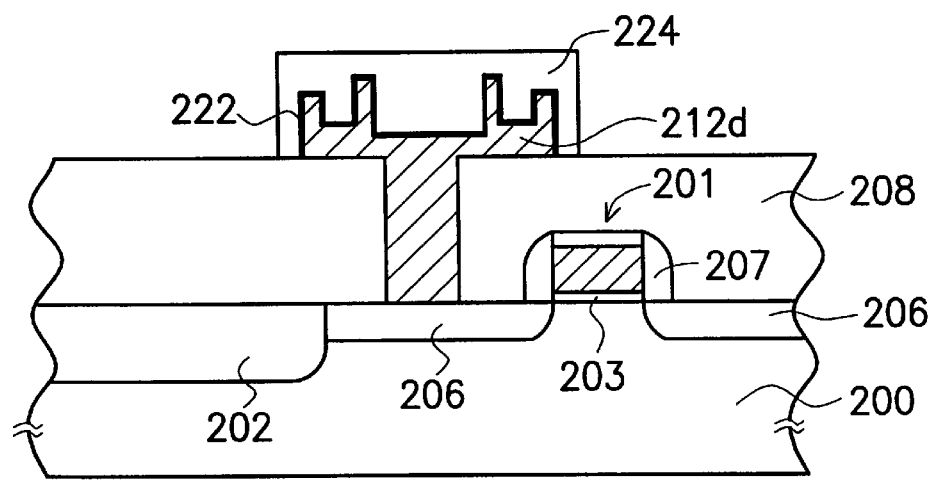

In FIG. 2F, the spacers 217, 218 are used as masks and the dielectric layer 208 is used as etching stop layer. An etching step is performed. A portion of the conductive layer 212c is removed to form a concentric double-cylinder conductive layer 212d. The conductive layer 212c can be removed by anisotropic etching. The concentric double-cylinder conductive layer 212d is used as a storage electrode. The spacer 217 and the spacer 218 are removed by wet etching, for example. A dielectric film 222 and a conductive layer 224 are formed in sequence over the substrate 200. A capacitor is formed. The dielectric film 222 can be, for example, a silicon oxide layer, a silicon nitride/silicon oxide (NO) layer, a silicon oxide/silicon nitride/silicon oxide (ONO) layer, a $Ta_2O_5$ layer, a $Pb(Zr, Ti)O_3$ layer (PZT layer), a $(Ba, Sr)TiO_3$ layer (BST layer), or other layer with high dielectric constant. The conductive layer 224 can be a polysilicon layer formed by chemical vapor deposition, for example. In addition, the polysilicon layer is doped at the same time.

In summary, the characteristic of the present invention is to form a concentric double-cylinder storage electrode, in which the effective area of the storage electrode is enlarged while still in a limited planar area. Hence, the present invention increase the storage ability of the capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor comprising the steps of:

providing a substrate having a transistor thereon, wherein the transistor includes a source/drain region;

forming a dielectric layer on the substrate, wherein the dielectric layer has an contact hole formed therein to exposed the source/drain region;

forming a first conductive layer over the substrate to fill the contact hole and to electrically couple with the source/drain region through the contact hole;

forming an isolation layer on the first conductive layer;

patterning the isolation layer and the first conductive layer to form a patterned isolation layer and a raised region above the contact hole, wherein the raised region is a portion of the first conductive layer, the patterned isolation layer is located on the raised region, and the planar area of the raised region and the patterned isolation layer are the same;

forming a first spacer on a sidewall of the patterned isolation layer and the raised region;

removing the patterned isolation layer;

using the first spacer as a mask and performing a first etching step to remove a portion of the first patterned conductive layer to form a first sidewall and a second sidewall of the first patterned conductive layer;

removing the first spacer;

forming a second spacer on the first sidewall and a third spacer on the second sidewall;

using the second spacer and the third spacer as masks and the dielectric layer as etching stop layer and performing a second etching step to remove a portion of the first patterned conductive layer to from a second conductive layer, wherein the second patterned conductive layer is used as a storage electrode;

removing the second spacer and the third spacer; and forming a dielectric film and a second conductive layer in sequence over the substrate.

2. The method of claim 1, wherein the material of the isolation layer includes silicon nitride.

3. The method of claim 1, wherein the etching rate of the first spacer and first conductive layer are different.

4. The method of claim 1, wherein the material of the first spacer includes silicon oxide.

5. The method of claim 4, wherein the material of the first conductive layer includes doped polysilicon.

6. The method of claim 1, wherein the first etching step includes anisotropic etching.

7. The method of claim 1, wherein the etching rates of the second spacer and the first conductive layer are different, and the etching rates of the third spacer and the first conductive layer are different.

8. The method of claim 1, wherein the material of the second spacer includes silicon oxide.

9. The method of claim 8, wherein the material of the third spacer includes silicon oxide.

10. The method of claim 1, wherein the second etching step includes anisotropic etching.

11. The method of claim 1, wherein the material of the dielectric film layer includes silicon oxide.

12. The method of claim 1, wherein the dielectric film includes a silicon nitride/silicon oxide layer.

13. The method of claim 1, wherein the dielectric film includes a silicon oxide/silicon nitride/silicon oxide layer.

14. The method of claim 1, wherein the dielectric film includes a $Ta_2O_5$ layer.

15. The method of claim 1, wherein the material of the second conductive layer includes doped polysilicon.

16. A method of fabricating a capacitor comprising the steps of:

providing a substrate having a transistor thereon, wherein the transistor includes a source/drain region;

forming a first dielectric layer on the substrate, wherein the first dielectric layer has a contact hole formed therein to exposed the source/drain region;

forming a first polysilicon layer over the substrate to fill the contact hole and is electrically coupled with the source/drain region through the contact hole;

forming a silicon oxide layer on the first conductive layer;

patterning the silicon oxide layer and the first polysilicon layer to form a patterned silicon oxide layer and a raised region over the contact hole, wherein the raised region is a portion of the first polysilicon layer, the patterned silicon oxide layer is located on the raised region, and the planar area of the raised region and the patterned silicon oxide layer are the same;

forming a first spacer on the sidewall of the patterned silicon oxide layer and the raised region;

removing the patterned silicon oxide layer;

using the first spacer as a mask and performing a first etching step to remove a portion of the first patterned polysilicon layer to form a first sidewall and a second sidewall of the first patterned polysilicon layer;

removing the first spacer;

forming a second spacer on the first sidewall and a third spacer on the second sidewall;

using the second spacer and the third spacer as masks and the dielectric layer as an etching stop layer and performing a second etching step to remove a portion of the first patterned polysilicon layer to form a second patterned polysilicon layer, wherein the second patterned polysilicon layer is used as a storage electrode;

removing the second spacer and the third spacer; and forming a dielectric film and a second conductive layer in sequence over the substrate.

17. The method of claim 16, wherein the etching rates of the first spacer and first polysilicon layer are different.

18. The method of claim 16, wherein the material of the first spacer includes silicon oxide.

19. The method of claim 16, wherein the etching rates of the second spacer and the first polysilicon layer are different, and the etching rates of the third spacer and the first polysilicon layer are different.

20. The method of claim 16, wherein the material of the second spacer and the third spacer include silicon oxide.

* * * * *